US010003317B2

(12) United States Patent
Li et al.

(10) Patent No.: US 10,003,317 B2
(45) Date of Patent: Jun. 19, 2018

(54) TUBULAR RESONANT FILTER AND METHOD OF MAKING A TUBULAR RESONANT FILTER

(71) Applicant: The Board of Trustees of the University of Illinois, Urbana, IL (US)

(72) Inventors: Xiuling Li, Champaign, IL (US); Moyang Li, Urbana, IL (US); Wen Huang, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 132 days.

(21) Appl. No.: 15/092,979

(22) Filed: Apr. 7, 2016

(65) Prior Publication Data
US 2016/0301377 A1 Oct. 13, 2016

Related U.S. Application Data

(60) Provisional application No. 62/144,516, filed on Apr. 8, 2015.

(51) Int. Cl.
*H03H 7/01* (2006.01)
*H03H 1/00* (2006.01)

(52) U.S. Cl.
CPC ..... *H03H 7/0115* (2013.01); *H03H 2001/005* (2013.01); *H03H 2001/0042* (2013.01); *H03H 2001/0085* (2013.01)

(58) Field of Classification Search
CPC ..... H03H 2001/0042; H03H 2001/005; H03H 7/0115; H03H 2001/0085
USPC .......................... 333/175, 185; 336/200, 206
See application file for complete search history.

(56) References Cited

U.S. PATENT DOCUMENTS

| 7,707,714 | B2 | 5/2010 | Schmidt et al. |
| 8,941,460 | B2 | 1/2015 | Li et al. |
| 9,018,050 | B2 | 4/2015 | Li et al. |
| 9,224,532 | B2 | 12/2015 | Li et al. |
| 2003/0197578 | A1* | 10/2003 | Shibahara ................ H03H 7/01 333/193 |
| 2008/0049376 | A1* | 2/2008 | Stevenson .............. A61N 1/056 361/302 |

(Continued)

FOREIGN PATENT DOCUMENTS

EP    2 423 162 A1    2/2012

OTHER PUBLICATIONS

Ali, M.S. Mohamed et al., "Out-of-plane spiral-coil inductor self-assembled by locally controlled bimorph actuation," *Micro & Nano Letters*, 6, 12 (2011) pp. 1016-1018.

(Continued)

*Primary Examiner* — Rakesh Patel
(74) *Attorney, Agent, or Firm* — Brinks Gilson & Lione

(57) ABSTRACT

A tubular resonant filter comprises a multilayer sheet in a rolled configuration comprising multiple turns about a longitudinal axis, where the multilayer sheet includes a strain-relieved layer, a patterned first conductive layer on the strain-relieved layer, an insulating layer on the patterned first conductive layer, and a patterned second conductive layer on the insulating layer and the patterned first conductive layer. The patterned first and second conductive layers and the insulating layer are interrelated to form a rolled-up inductor connected to a rolled-up capacitor on the strain-relieved layer.

20 Claims, 10 Drawing Sheets

(56) References Cited

U.S. PATENT DOCUMENTS

2015/0099116 A1   4/2015  Li et al.

OTHER PUBLICATIONS

Arora, William J. et al., "Membrane folding to achieve three-dimensional nanostructures: Nanopatterned silicon nitride folded with stressed chromium hinges," *Applied Physics Letters*, 88, 053108 (2006) pp. 053108-1-053108-3.

Bianucci, P. et al., "Self-Organized 1.55 µm InAs/InP Quantum Dot Tube Nanoscale Coherent Light Sources," *Winter Topicals (WTM)* IEEE, Conference Publication (2011), pp. 127-128.

Bof Bufon, Carlos César et al., "Self-Assembled Ultra-Compact Energy Storage Elements Based on Hybrid Nanomembranes," *Nano Letters*, 10 (2010) pp. 2506-2510.

Bogush, V. et al., "Electroless deposition of novel Ag—W thin films," *Microelectronic Engineering*, 70 (2003) pp. 489-494.

Chen, Daru et al., "A novel low-loss Terahertz waveguide: Polymer tube," *Optics Express*, 18, 4 (2010) pp. 3762-3767.

Chen, Y.M. et al., "A Ultra-Compact 77-GHz CMOS Bandpass Filter Using Grounded Pedestal Stepped-Impedance Stubs," *Proceedings of the 41st European Microwave Conference*, Manchester, UK (Oct. 10-13, 2011) pp. 194-197.

Chun, Ik Su et al., "Controlled Assembly and Dispersion of Strain-Induced InGaAs/GaAs Nanotubes," *IEEE Transactions on Nanotechnology*, 7, 4 (2008) pp. 493-495.

Chun, I.S. et al., "InGaAs/GaAs 3D architecture formation by strain-induced self-rolling with lithographically defined rectangular stripe arrays," *Journal of Crystal Growth*, 310 (2008) pp. 2353-2358.

Chun, Ik Su et al., "Geometry Effect on the Strain-Induced Self-Rolling of Semiconductor Membranes," *Nano Letters*, 10 (2010) pp. 3927-3932.

Dai, Lu et al., "Directional scrolling of SiGe/Si/Cr nanoribbon on Si(111) surfaces controlled by two-fold rotational symmetry underetching," *Nanoscale*, 5 (2013) pp. 971-976.

Dai, L. et al., "Strain-driven self-rolling mechanism for anomalous coiling of multilayer nanohelices," *Journal of Applied Physics*, 106, 114314 (2009) pp. 114314-1-114314-5.

Doerner, M. et al., "Stresses and Deformation Processes in Thin Films on Substrates," *CRC Critical Reviews in a Solid State and Materials Sciences*, 14, 3 (1988) pp. 224-268.

Du, Frank et al., "Aligned arrays of single walled carbon nanotubes for transparent electronics," *Proceedings of SPIE*, 8725 (2013) pp. 87251S-1-87251S-7.

Franc, A.L. et al., "High-Performance Shielded Coplanar Waveguides for the Design of CMOS 60-GHz Bandpass Filters," *IEEE Transactions on Electron Devices*, 59, 5 (2012) pp. 1219-1226.

Frankel, Michael Y., "Terahertz Attenuation and Dispersion Characteristics of Coplanar Transmission Lines," *IEEE Transactions on Microwave Theory and Techniques*, 39, 6 (1991), pp. 910-916.

Golod, S. V. et al., "Fabrication of conducting GeSi/Si micro- and nanotubes and helical microcoils," *Semiconductor Science and Technology*, 16 (2001) pp. 181-185.

Golod, S.V. et al., "Freestanding SiGe/Si/Cr and SiGe/Si/Si$_x$N$_y$/Cr Microtubes," *Applied Physics Letters*, 84, 17 (2004) pp. 3390-3393.

Gorin, A. et al., "Fabrication of silicon nitride waveguides for visible-light using PECVD: A study of the effect of plasma frequency on optical properties," *Optics Express*, 16, 18 (2008) pp. 13509-13516.

Harazim, Stefan M. et al., "Fabrication and applications of large arrays of multifunctional rolled-up SiO/SiO2 microtubes," *Journal of Materials Chemistry*, 22, 7 (2012) pp. 2878-2884.

Heijden, van der E. et al., "On-Chip Third-Order Band-Pass Filters for 24 and 77 GHz Car Radar," *Microwave Symposium Digest, IEEE MTT-S International* (Jun. 11-16, 2006) pp. 697-700.

Heiliger, H.-M. et al., "Low-dispersion thin-film microstrip lines with cyclotene (benzocyclobutene) as dielectric medium," *Applied Physics Letters*, 70, 17 (1997) pp. 2233-2235.

Huang, G. S. et al., "Optical properties of rolled-up tubular microcavities from shaped nanomembranes," *Applied Physics Letters*, 94, 141901 (2009) 141901-1-141901-3.

Huang, Minghuang et al., "Nanomechanical Architecture of Strained Bilayer Thin Films: From Design Principles to Experimental Fabrication," *Advanced Materials*, 17 (2005) pp. 2860-2864.

Huang, Gaoshan et al., "Thinning and Shaping Solid Films into Functional and Integrative Nanomembranes," *Advanced Materials*, 24 (2012) pp. 2517-2546.

Huang, Gaoshan et al., "Rolled-up transparent microtubes as two-dimensionally confined culture scaffolds of individual yeast cells," *Lab Chip*, 9 (2009) pp. 263-268.

Huang, Minghuang et al., "Mechano-electronic Superlattices in Silicon Nanoribbons," *ACS Nano*, 3, 3 (2009) pp. 721-727.

Huang, W. et al., "Precision Structural Engineering of Self-Rolled-Up 3D Nanomembranes Guided by Transient Quasi-Static FEM Modeling," *Nano Lett.* 14 (2014) pp. 6293-6297.

Huang, W. et al., "On-Chip Inductors with Self-Rolled-Up SiN$_x$ Nanomembrane Tubes: A Novel Design Platform for Extreme Miniaturization," *Nano Lett.* 12 (2012) pp. 6283-6288.

Inberg, A. et al., "Novel Highly Conductive Silver-Tungsten Thin Films Electroless Deposited from Benzoate Solution for Microelectronic Applications," *Journal of The Electrochemical Society*, 150, 5 (2003) pp. C285-C291.

Ishigaki, Tsukasa et al., "Photonic-Crystal Slab for Terahertz-Wave Integrated Circuits," *Photonics Conference (IPC) IEEE, Conference Publication* (2012) pp. 774-775.

Jan, C.-H. et al., "A 32nm SoC Platform Technology with 2$^{nd}$ Generation High-k/Metal Gate Transistors Optimized for Ultra Low Power, High Performance, and High Density Product Applications," *IEEE*, (2009) pp. 647-650.

Jiang, Hongrui et al., "On-Chip Spiral Inductors Suspended over Deep Copper-Lined Cavities," *IEEE Transactions on Microwave Theory and Techniques*, 48, 12 (2000) pp. 2415-2423.

Li, Feng et al., "Coherent emission from ultrathin-walled spiral InGaAs/GaAs quantum dot microtubes," *Optics Letters*, 34, 19 (2009) pp. 2915-2917.

Li, Weizhi et al., "Influences of Process Parameters of Low Frequency PECVD Technology on Intrinsic Stress of Silicon Nitride Thin Film," *Proc. of SPIE*, 7658 (2010) pp. 765824-1-765824-7.

Li, Xiuling, "Self-rolled-up microtube ring resonators: a review of geometrical and resonant properties," *Advances in Optics and Photonics*, 3 (2011) pp. 366-387.

Li, Xiuling, "Strain induced semiconductor nanotubes: from formation process to device applications," *Journal of Physics D: Applied Physics*, 41 (2008) 193001, pp. 1-12.

Lin, C.-Y. et al., "One-Decibel Insertion Loss 1-14.3 GHz Ultrawideband Bandpass Filter Using Standard 0.18 µm CMOS Technology," *Microwave and Optical Technology Letters* 54, 4 (2012) pp. 1044-1047.

Logeeswaran, V. J. et al., "Ultrasmooth Silver Thin Films Deposited with a Germanium Nucleation Layer," *Nano Letters*, 9, 1 (2009) pp. 178-182.

Luchnikov, V. et al., "Toroidal hollow-core microcavities produced by self-rolling of strained polymer bilayer films," *Journal of Micromechanics and Microengineering*, 18 (2008) 035041, pp. 1-5.

Luo, J. K. et al., "Modelling and fabrication of low operation temperature microcages with a polymer/metal/DLC trilayer structure," *Sensors and Actuators A*, 132 (2006) pp. 346-353.

Masi, Maurizio et al., "Modeling of Silicon Nitride Deposition by RF Plasma-Enhanced Chemical Vapor Deposition," *Chemical Engineering Science*, 49, 5 (1994) pp. 669-679.

Mei, Yongfeng et al., "Versatile Approach for Integrative and Functionalized Tubes by Strain Engineering of Nanomembranes on Polymers," *Advanced Materials*, 20 (2008) pp. 4085-4090.

Mi, Zetian et al., "1.3-1.55 µm Self-Organized InAs Quantum Dot Tube Nanoscale Lasers on Silicon," *Photonics Conference (PHO), IEEE, Conference Publication* (2011) pp. 535-536.

Mitrofanov, Oleg et al., "Reducing Transmission Losses in Hollow THz Waveguides," *IEEE Transactions on Terahertz Science and Technology*, 1, 1 (2011) pp. 124-132.

(56) References Cited

OTHER PUBLICATIONS

Mitrofanov, Oleg et al., "Dielectric-lined cylindrical metallic THz waveguides: mode structure and dispersion," *Optics Express*, 18, 3 (2010) pp. 1898-1903.
Moiseeva, E. et al., "Single-mask microfabrication of three-dimensional objects from strained bimorphs," *Journal of Micromechanics and Microengineering*, 17 (2007) pp. N63-N68.
Muller, Christian et al., "Tuning giant magnetoresistance in rolled-up Co—Cu nanomembranes by strain engineering," *Nanoscale*, 4 (2012) pp. 7155-7160.
Nguyen, Nhat M. et al., "Si IC-Compatible Inductors and LC Passive Filters," *IEEE Journal of Solid-State Circuits*, 25, 4 (1990) pp. 1028-1031.
Pahlevaninezhad, H. et al., "Advances in Terahertz Waveguides and Sources," *IEEE Photonics Journal*, 3, 2 (2011) pp. 307-310.
Pang, Liang et al., "Transfer printing of flexible hybrid inductor-capacitor filters via pre-etched silicon-on-insulator mother wafer," *Applied Physics Letters*, 101, 063113 (2012) pp. 063113-1-063113-4.
Park, Min et al., "The Detailed Analysis of High Q CMOS-Compatible Microwave Spiral Inductors in Silicon Technology," *IEEE Transactions on Electron Devices*, 45, 9 (1998) pp. 1953-1959.
Parvizian, M. et al., "Residual stress improvement of platinum thin film in Au/Pt/Ti/p—GaAs ohmic contact by RF sputtering power," *Applied Surface Science*, 260 (2012) pp. 77-79.
Prinz, V. Ya. et al., "Free-standing and overgrown InGaAs/GaAs nanotubes, nanohelices and their arrays," *Physica E*, 6 (2000) pp. 828-831.
Rottler, Andreas et al., "Rolled-up nanotechnology for the fabrication of three-dimensional fishnet-type GaAs-metal metamaterials with negative refractive index at near-infrared frequencies," *Applied Physics Letters*, 100, 151104 (2012) pp. 151104-1-151104-4.
Schulze, Sabine et al., "Morphological Differentiation of Neurons on Microtopographic Substrates Fabricated by Rolled-Up Nanotechnology," *Advanced Engineering Materials*, 12, 9 (2010), pp. B558-B564.
Seidel, H. et al., "Anisotropic Etching of Crystalline Silicon in Alkaline Solutions," *J. Electrochem. Soc.*, 137, 11 (1990) pp. 3612-3632.
Seleznev, V. A. et al., "Generation and Registration of Disturbances in a Gas Flow. 1. Formation of Arrays of Tubular Microheaters and Microsensors," *Journal of Applied Mechanics and Technical Physics*, 50, 2 (2009) pp. 291-296.
Shacham-Diamand, Yosi et al., "Electroless Silver and Silver with Tungsten Thin Films for Microelectronics and Microelectromechanical System Applications," *Journal of the Electrochemical Society*, 147, 9 (2000) pp. 3345-3349.
Shaman, H.N. et al., "Recent Development of Ultra-Wideband (UWB) Bandpass Filters Using Distributed Stub Transmission Line Structures," *Microwave Symposium (MMS) Mediterranean* (Nov. 15-17, 2009) pp. 1-4.
Shiplyuk, A. N. et al., "Generation and Registration of Disturbances in a Gas Flow. 2. Experiments with Arrays of Tubular Microheaters and Microsensors," *Journal of Applied Mechanics and Technical Physics*, 50, 3 (2009) pp. 454-458.

Smith, Donald L. et al., "Mechanism of $SiN_xH_y$ Deposition from $NH_3$—$SiH_4$ Plasma," *J. Electrochem. Soc.*, 137, 2 (1990) pp. 614-623.
Smith, Elliot J. et al., "Lab-in-a-Tube: Detection of Individual Mouse Cells for Analysis in Flexible Split-Wall Microtube Resonator Sensors," *Nano Letters*, 11 (2011) pp. 4037-4042.
Songmuang, R. et al., "From rolled-up Si microtubes to $SiO_x$/Si optical ring resonators," *Microelectronic Engineering*, 84 (2007) pp. 1427-1430.
Tang, Chih-Chun et al., "Miniature 3-D Inductors in Standard CMOS Process," *IEEE Journal of Solid-State Circuits*, 37, 4 (2002) pp. 471-480.
Tian, Dongbin et al., "Dual cylindrical metallic grating-cladding polymer hollow waveguide for terahertz transmission with low loss," *Applied Physics Letters*, 97, (2010) pp. 133502-1-133502-3.
Tian, Zhaobing et al., "Controlled Transfer of Single Rolled-Up InGaAs—GaAs Quantum-Dot Microtube Ring Resonators Using Optical Fiber Abrupt Tapers," *IEEE Photonics Technology Letters*, 22, 5 (2010) pp. 311-313.
Tian, Zhaobing et al., "Single rolled-up InGaAs/GaAs quantum dot microtubes integrated with silicon-on-insulator waveguides," *Optics Express*, 19, 13 (2011) pp. 12164-12171.
Timoshenko, S., "Analysis of Bi-Metal Thermostats," *Journal of the Optical Society of America*, 11 (1925) pp. 233-255.
Walmsley, Byron A. et al., "Poisson's Ratio of Low-Temperature PECVD Silicon Nitride Thin Films," *Journal of Microelectromechanical Systems*, 16, 3 (2007) pp. 622-627.
Wang, To-Po et al., "High-Q Micromachined Inductors for 10-to-30-GHz RFIC Applications on Low Resistivity Si-Substrate," *Proceedings of the 36th European Microwave Conference*, (2006) pp. 56-59.
Wheeler, Harold A., "Formulas for the Skin Effect," *Proceedings of the I.R.E.*, (1942) pp. 412-424.
Wiemer, L. et al., "Determination of Coupling Capacitance of Underpasses, Air Bridges and Crossings in MICs and MMICs," *Electronics Letters*, 23, 7 (1987) pp. 344-346.
Xu, Xiangdong et al., "Chemical Control of Physical Properties in Silicon Nitride Films," *Appl. Phys. A.*, 111 (2013) pp. 867-876.
Yue, C. Patrick et al., "A Physical Model for Planar Spiral Inductors on Silicon," *IEEE, IEDM*, 96 (1996) pp. 155-158.
Yue, C. Patrick et al., "Physical Modeling of Spiral Inductors on Silicon," *IEEE Transactions on Electron Devices*, 47, 3 (2000) pp. 560-568.
Yu, Minrui et al., "Semiconductor Nanomembrane Tubes: Three-Dimensional Confinement for Controlled Neurite Outgrowth," *ACS Nano*, 5, 4 (2011) pp. 2447-2457.
Zang, Ji et al., "Mechanism for Nanotube Formation from Self-Bending Nanofilms Driven by Atomic-Scale Surface-Stress Imbalance," *Physical Review Letters*, 98, (2007) pp. 146102-1-146102-4.
Zhang, Z. et al., "Micromachined Passive Bandpass Filters Based on GaAs Monolithic-Microwave-Integrated-Circuit Technology," *IEEE Transactions on Electron Devices* 60, 1 (2013) pp. 221-228.
Zolfaghari, Alireza et al., "Stacked Inductors and Transformers in CMOS Technology," *IEEE Journal of Solid-State Circuits*, 36, 4 (2001) pp. 620-628.

\* cited by examiner

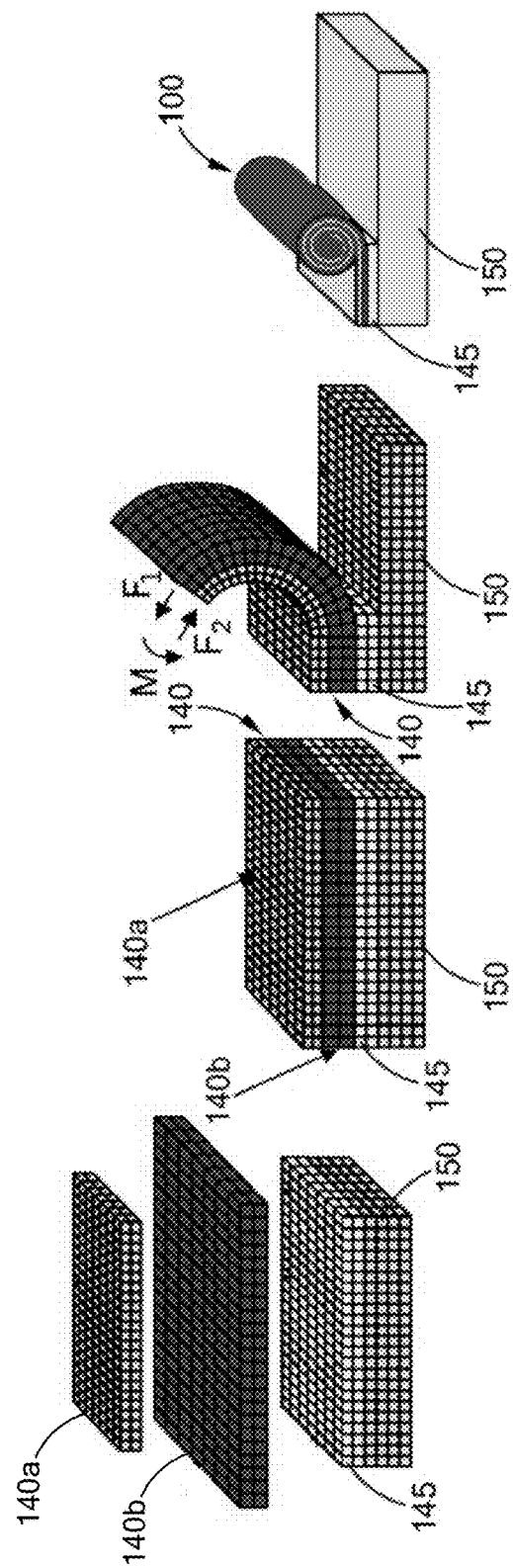

TUBULAR RESONANT FILTER AND METHOD OF MAKING A TUBULAR RESONANT FILTER

RELATED APPLICATIONS

The present patent document claims the benefit of priority under 35 U.S.C. § 119(e) to U.S. Provisional Patent Application Ser. No. 62/144,516, filed on Apr. 8, 2015, which is hereby incorporated by reference in its entirety.

FEDERALLY SPONSORED RESEARCH OR DEVELOPMENT

This invention was made with government support under award number ECCS-1309375 from the National Science Foundation. The government has certain rights in the invention.

TECHNICAL FIELD

The present disclosure is directed generally to filters for radiofrequency integrated circuits (RFICs), and more particularly to filters fabricated using self-rolled-up membrane (S-RUM) technology.

BACKGROUND

Filters are essential RFIC components for selecting a target frequency spectrum and suppressing spectral components at image frequencies. Although filters have been researched for decades, state-of-the-art technologies have serious shortcomings that have proven difficult to overcome. For example, lumped element filters cannot be used at frequencies above X band (~8.0-12.0 GHz), and distributed filters suffer from a large footprint and are therefore hard to integrate on-chip monolithically. In addition, the performance of state-of-the-art filters may be severely limited by substrate losses caused by electric and magnetic couplings between the resonator and substrate.

BRIEF SUMMARY

A tubular resonant filter has been developed to overcome the shortcomings of existing filters used in RFICs.

The tubular resonant filter comprises a multilayer sheet in a rolled configuration comprising multiple turns about a longitudinal axis, where the multilayer sheet includes a strain-relieved layer, a patterned first conductive layer on the strain-relieved layer, an insulating layer on the patterned first conductive layer, and a patterned second conductive layer on the insulating layer and the patterned first conductive layer. The patterned first and second conductive layers and the insulating layer are interrelated to form a rolled-up inductor connected to a rolled-up capacitor on the strain-relieved layer.

A method of making the tubular resonant filter includes: forming a sacrificial layer on a substrate; forming a strained layer on the sacrificial layer, where the strained layer comprises an upper portion under tensile stress and a lower portion under compressive stress and is held on the substrate by the sacrificial layer; forming a patterned first conductive layer on the strained layer; forming an insulating layer on the patterned first conductive layer; forming a patterned second conductive layer on the insulating layer and the patterned first conductive layer; initiating removal of the sacrificial layer from the substrate, thereby releasing an end of the strained layer; and continuing the removal of the sacrificial layer, thereby allowing the strained layer including the patterned first and second conductive layers and the insulating layer to move away from the substrate and roll up to relieve strain in the strained layer. A tubular resonant filter including a rolled-up inductor electrically connected to a rolled-up capacitor is thus formed.

BRIEF DESCRIPTION OF THE DRAWINGS

FIGS. 1A-1D are schematics providing an introduction to self-rolled-up membrane (S-RUM) technology.

(FIG. 9B) a low pass filter with cut-off frequency at 8 GHz; (FIG. 9C) a high pass filter with cut-off frequency at 15 GHz; (FIG. 9D) a band pass filter with center frequency at 8.5 GHz; (FIG. 9E) a band pass filter with center frequency at 26 GHz; (FIG. 9F) a band pass filter with center frequency at 60 GHz; and (FIG. 9G) a band pass filter with center frequency at 73 GHz.

DETAILED DESCRIPTION

Figure 2A:
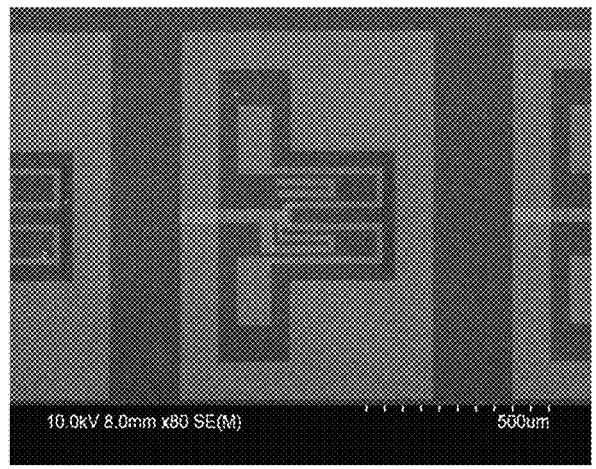
FIGS. 2A-2C show SEM images of an exemplary tubular resonant filter before (FIG. 2A) and after (FIGS. 2B-2C) rolling up.

Described herein are three-dimensional (3D) tubular resonant filters formed in a self-rolling process that may have a greatly reduced on-chip footprint and significant performance improvement in RFICs. The tubular resonant filters combine the advantages of lumped element and distributed filters and have a strong immunity to substrate effects due to their extremely small footprint and minimized parasitic couplings. The rolled-up resonant filters can realize all-frequency-band design on any substrate up to 80 GHz. Prior to rolling up, the tubular resonant filters have a carefully designed multilayer planar structure that includes patterned conductive and insulating layers on a strained layer. After rolling up, the filters include rolled-up inductors and capacitors with different terminations, depending on the planar design. Low pass, high pass, and band pass tubular filters with high electrical performance can thus be created using self-rolled-up membrane (S-RUM) technology.

FIGS. 1A-1D provide an introduction to the self-rolling concept. Rolled-up micro- and nanodevice structures may form spontaneously when planar multilayer sheets including strained layers deform as a consequence of energy relaxation. Referring to FIGS. 1A and 1B, a planar multilayer sheet may include conductive and insulating layers (not visible in this figure) on an oppositely strained bilayer 140 (e.g., a top layer 140a in tension on a bottom layer 140b in compression), which is in contact with a sacrificial interlayer 145 on a substrate 150 and which may be referred to as a strained layer 140. The oppositely strained layer 140 may be released from the substrate 150 as the sacrificial layer 145 is etched away, as illustrated in FIG. 1C. Once released, the opposing strain within the layer 140 generates a net momentum, driving the planar sheet to scroll up and continue to roll into a tubular or spiral structure 100, as shown in FIG. 1D. During roll-up, residual stress in the strained layer 140 is fully or partially relieved. Accordingly, a rolled portion of the strained layer 140 may be referred to as a strain-relieved layer 140. The conductive and insulating layers, which are shown in other figures, can also provide additional residual stress (e.g., tensile stress) to facilitate rolling.

Figure 2B:
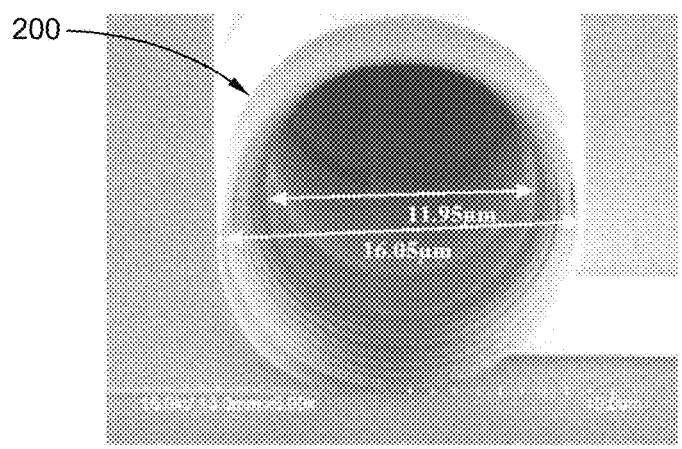
Figure 2C:
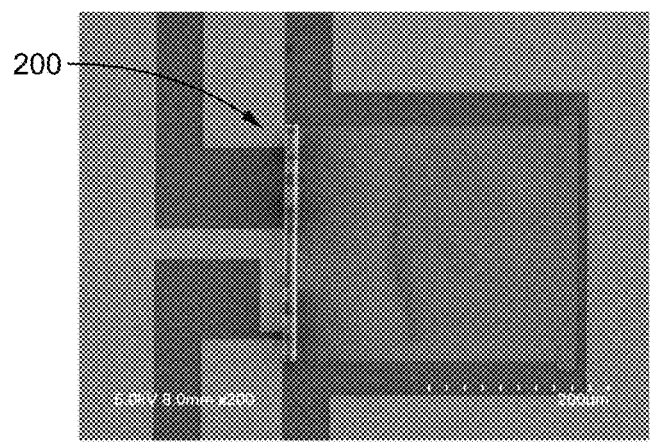

Referring now to FIGS. 2A-2C, an exemplary tubular resonant filter 200 for a RFIC is shown in scanning electron microscope (SEM) images before and after rolling up. The tubular filter comprises a multilayer sheet having a released end and a constrained end, where the released end is in a rolled configuration comprising multiple turns about a longitudinal axis. Prior to roll-up, the filter has a planar multilayer structure that includes patterned first and second conductive layers and an insulating layer on a strained layer. The patterned first and second conductive layers and the insulating layer are interrelated on the strained layer so as to define, after roll-up of the multilayer sheet, a rolled-up capacitor connected to a rolled-up inductor on the strain-relieved layer. FIG. 2B shows a side cross-sectional view and FIG. 2C shows a top view of the exemplary tubular resonant filter, in this case a band pass filter, which is formed after roll-up. Depending on the interrelationship of the layers, the tubular resonant filter may be a low-pass filter, a high-pass filter, or a band-pass filter, as discussed below in reference to FIG. 3B, 4B or 5.

Figure 3A:
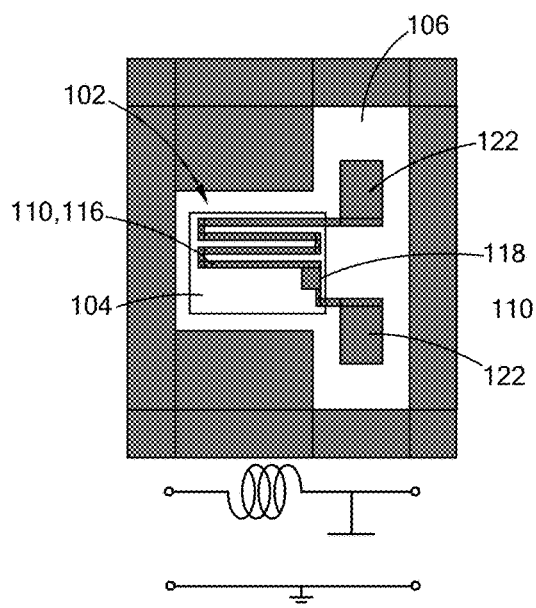
FIGS. 3A and 3B show top-view schematics of exemplary planar multilayer structures that may be used to form a low-pass tubular resonant filter.
Figure 3B:
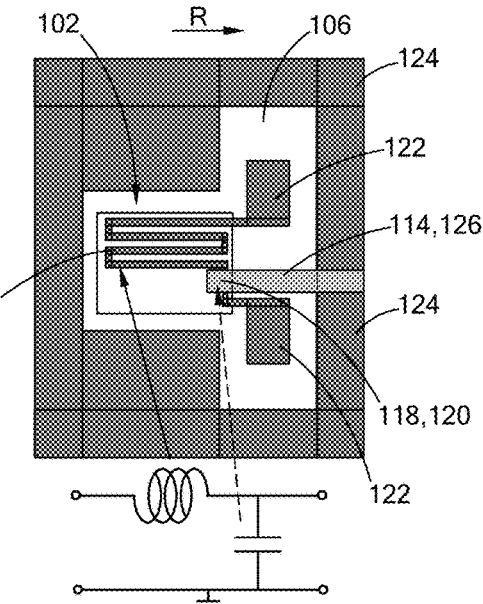

FIGS. 3A and 3B show top-view schematics of exemplary planar multilayer structures that may be used to form a low-pass filter. The schematic of FIG. 3A shows a substrate on which a sacrificial layer, strained layer and patterned first conductive layer have been formed. The schematic of FIG. 3B shows the same substrate after an insulating layer and patterned second conductive layer have been deposited on the previous layers. The interrelationship of the layers will be described in more detail below; however, it can be noted from the circuit diagram that a rolled-up inductor having a series connection and a rolled-up capacitor having a shunt connection may be formed after deposition of the insulating layer and patterned second conductive layer. By removing the sacrificial layer in a directional fashion (e.g., by preferential etching), strain may be relieved from the strained layer to permit the planar multilayer structure of FIG. 3B to roll up, thereby forming the low-pass filter.

Figure 4A:
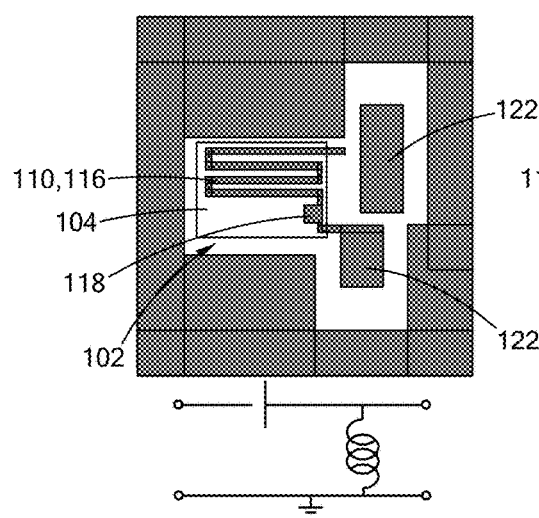
FIGS. 4A and 4B show top-view schematics of exemplary planar multilayer structures that may be used to form a high-pass tubular resonant filter.
Figure 4B:
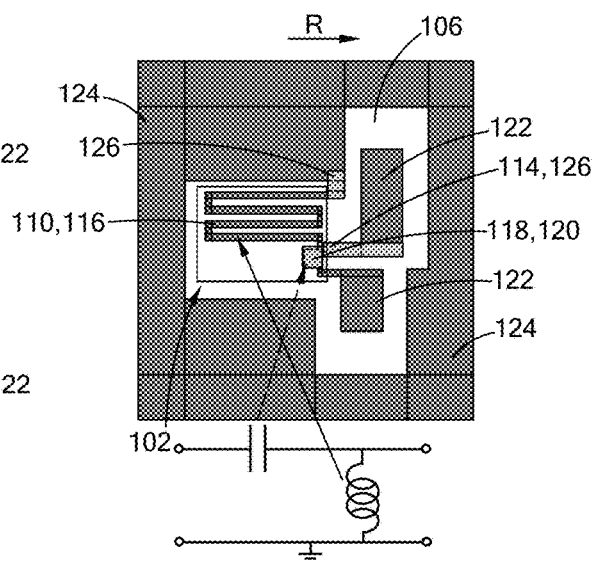

FIGS. 4A and 4B show top-view schematics of exemplary planar multilayer structures that may be used to form a high-pass filter. The schematic of FIG. 4A shows a substrate on which a sacrificial layer, strained layer and patterned first conductive layer have been formed. The schematic of FIG. 4B shows the same substrate after an insulating layer and patterned second conductive layer have been deposited on the previous layers. The interrelationship of the layers will be described in more detail below; however, it can be noted from the circuit diagram that a rolled-up inductor having a shunt connection and a rolled-up capacitor having a series connection may be formed after deposition of the insulating layer and patterned second conductive layer. By removing the sacrificial layer in a directional fashion (e.g., by preferential etching), strain may be relieved from the strained layer to permit the planar multilayer structure of FIG. 4B to roll up, thereby forming the high-pass filter.

Figure 5:
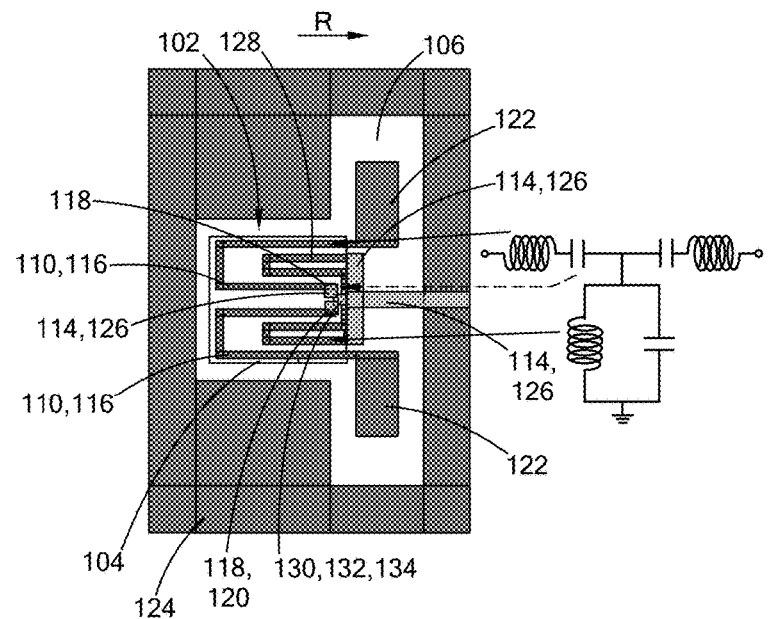
FIG. 5 shows a top-view schematic of an exemplary planar multilayer structure that may be used to form a band-pass tubular resonant filter.

FIG. 5 shows a top-view schematic of an exemplary planar multilayer structure that may be used to form a band-pass filter. The schematic of FIG. 5 shows a substrate on which a sacrificial layer, strained layer, patterned first conductive layer, insulating layer and patterned second conductive layer have been formed. The interrelationship of the layers will be described in more detail below; however, it can be noted from the circuit diagram that an LC circuit including at least one rolled-up inductor and rolled-up capacitor in the series branch and at least one rolled-up inductor and rolled-up capacitor in the shunt branch may be formed after deposition of all of the layers. By removing the sacrificial layer in a directional fashion (e.g., by preferential etching), strain may be relieved from the strained layer to permit the planar multilayer structure of FIG. 5 to roll up, thereby forming the band-pass filter, according to one embodiment.

Figures 6A, 6B:
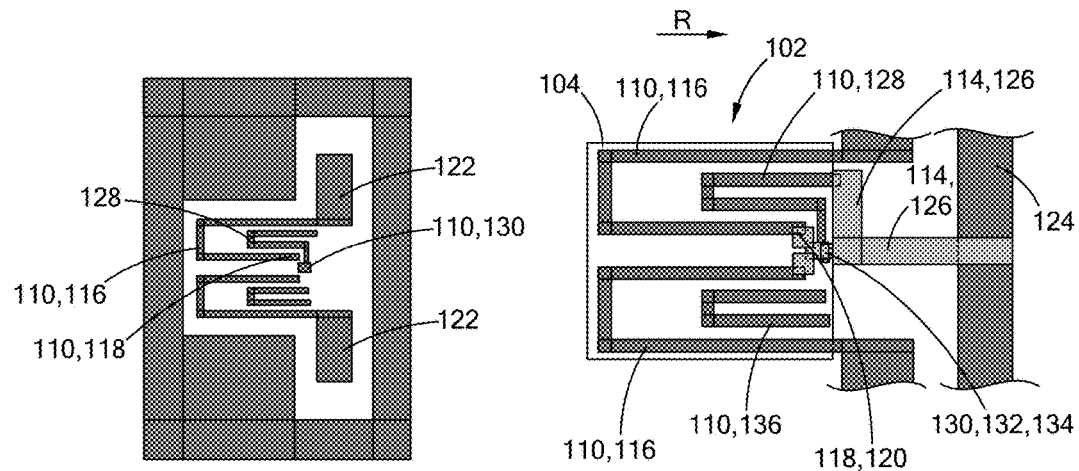
FIGS. 6A and 6B show top-view schematics of other exemplary planar multilayer structures that can be used to form a band-pass tubular resonant filter.
Figures 7A, 7B:
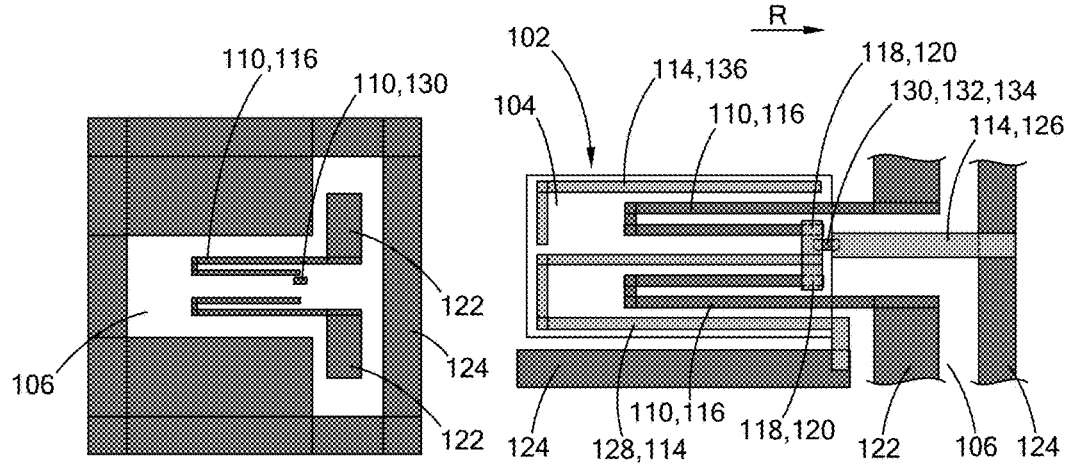
FIGS. 7A and 7B show top-view schematics of other exemplary planar multilayer structures that can be used to form a band-pass tubular resonant filter.

FIGS. 6A-6B and FIGS. 7A-7B show top-view schematics of other exemplary planar multilayer structures that can be used to form band pass filters. The schematics of FIGS. 6A and 7A show a substrate on which a sacrificial layer, strained layer and patterned first conductive layer have been formed. The schematics of FIGS. 6B and 7B shows the same substrate after an insulating layer and patterned second conductive layer have been deposited on the previous layers. The circuit diagram for these structures is similar to that shown for FIG. 5, where at least one inductor and at least one capacitor are present in the shunt branch and at least one inductor and at least one capacitor are present in the series branch of the LC circuit. By removing the sacrificial layer in a directional fashion (e.g., by preferential etching), strain may be relieved from the strained layer to permit the planar multilayer structure of each of FIGS. 6B and 7B to roll up, thereby forming a band-pass filter according to two different embodiments. The interrelationship of the layers in each of FIGS. 6B and 7B are described in more detail below.

Figures 8A, 8B:
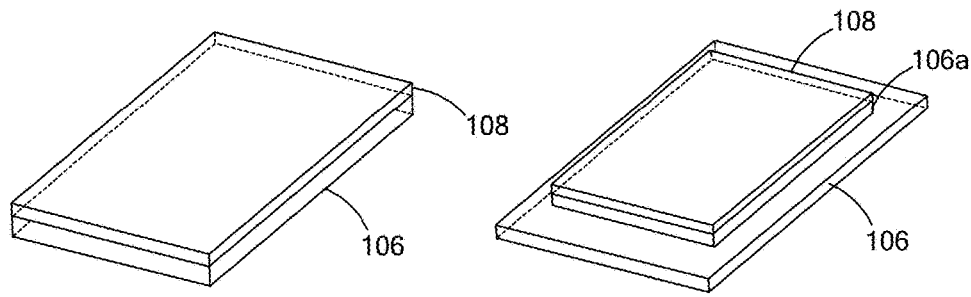
FIGS. 8A-8G show steps in preparing an exemplary planar multilayer structure that can form a tubular resonant filter upon roll-up.
Figures 8C, 8D:
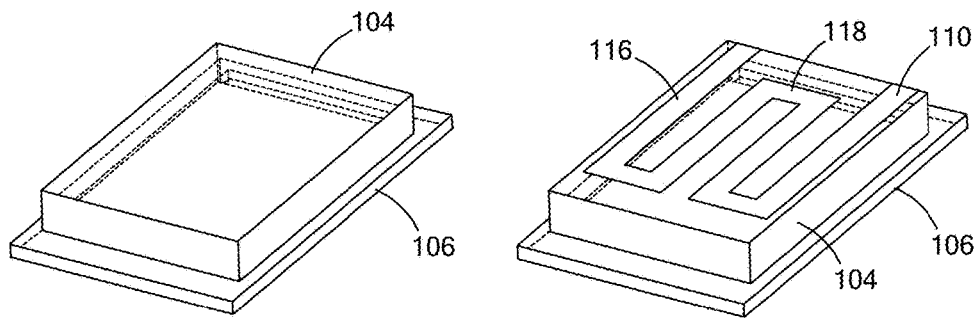
Figure 8E:
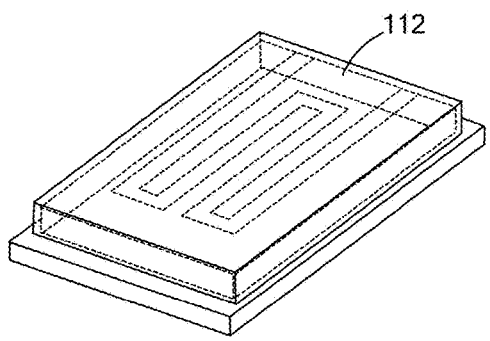
Figure 8F:
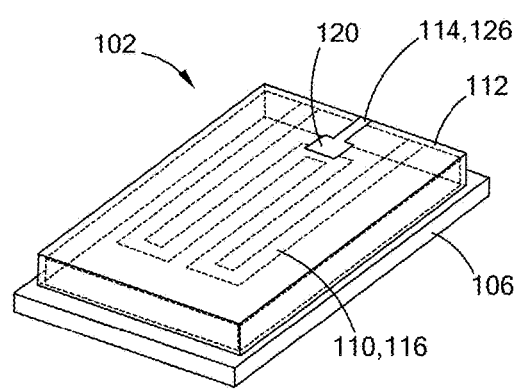
Figure 8G:
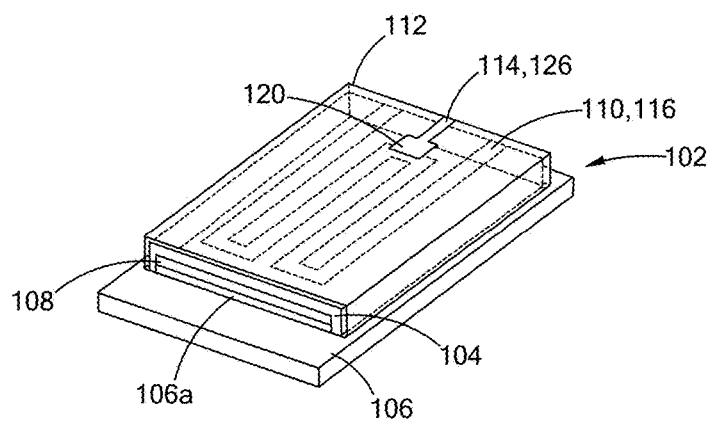

FIG. 8G shows a perspective view including an exposed cross-section of an exemplary multilayer structure prior to roll-up. Referring to FIG. 8G along with any of FIGS. 3A-7B, it can be seen that a planar multilayer sheet 102 comprising a strained layer 104 is disposed on a substrate 106. A mesa 106a may also be formed on the substrate 106 as described further below. A sacrificial layer 108 may be positioned between the substrate 106 and the strained layer 104 to facilitate release and roll-up of the sheet 102 after deposition of the layers. The planar multilayer sheet 102 further includes a patterned first conductive layer 110 on the strained layer 104, an insulating layer 112 on the patterned first conductive layer 110, and a patterned second conductive layer 114 on the patterned first conductive layer 110 and the insulating layer 112.

The patterned first conductive layer 110 comprises an inductor strip 116 and a capacitor bottom plate 118 in electrical contact with the inductor strip 116. The inductor strip 116 may be disposed on the strain-relieved layer 104 in a serpentine pattern having an amplitude extending in a rolling direction R. The serpentine pattern may be understood to have a sinusoidal periodicity with a size as small as half a period (e.g., a "U" shape) or any multiple (n) of half a period, where n is typically an odd integer. Accordingly, both ends of the inductor strip 116 may be situated at the same end (e.g., the constrained end) of the multilayer sheet 102.

The patterned second conductive layer 114 comprises a capacitor top plate 120 on a portion of the insulating layer 112 and overlying the capacitor bottom plate 118. When the strained layer 104 is released from the substrate 106, the multilayer sheet 102 scrolls up and the capacitor top and bottom plates 120,118 and the portion of the insulating layer 112 curve around the longitudinal axis, thereby forming the rolled-up capacitor. Simultaneously, the inductor strip 116 wraps around the longitudinal axis, thereby forming the rolled-up inductor. The longitudinal axis may be substantially perpendicular to the rolling direction R, where "substantially perpendicular to" may be understood to mean being within ±1°, or ±0.5°, of a perpendicular orientation.

On or adjacent to the constrained end of the multilayer sheet 102 may be two contact pads 122 and a common ground portion 124 electrically isolated from the two contact pads 122. At least one of the contact pads 122 may be connected to the inductor strip 116.

Referring now to FIG. 3B, both of the contact pads 122 may be connected to the inductor strip 116 to form a series connection of the rolled-up inductor, and a conductive line 126 may connect the capacitor top plate 120 to the common ground portion 124 to form a shunt connection of the rolled-up capacitor, thereby forming a low pass filter. The circuit diagram provided adjacent to the schematic shows that the rolled-up inductor is in the series branch and the rolled-up capacitor is in the shunt branch of the LC circuit. The cutoff frequency of the low pass filter may be in the range from 10 kHz to 300 GHz and in some cases from 100 MHz to 100 GHz. In one example of a fabricated device, the inductor strip 116 may be 270 µm in length and 15 µm in width. The multilayer sheet 102 may have an inner diameter of 9 µm when rolled up, and thus the inductor strip 116 may make 9 turns about the longitudinal axis, forming a rolled-up inductor with inductance of 0.8 nH. The capacitor top and bottom plates 120,118 may be 20 µm×20 µm in area, which provides a conductance of 132 fF at 5 GHz.

Referring to FIG. 4B, one of the contact pads 122 may be connected to the capacitor bottom plate 118 and one of the contact pads 122 may be connected to the capacitor top plate 120 via a conductive line 126 to form a series connection of the rolled-up capacitor. In addition, a conductive line 126 may connect the inductor strip 116 to the common ground portion 124 to form a shunt connection of the rolled-up inductor, thereby forming a high pass filter. The cutoff frequency of the high pass filter may be in the range from 10 kHz to 300 GHz and in some cases from 100 MHz to 100 GHz. The circuit diagram provided adjacent to the schematic shows that the rolled-up inductor is in the shunt branch and the rolled-up capacitor is in the series branch of the LC circuit.

Referring to FIG. 5, both of the contact pads 122 may be connected to the inductor strip 116 and the capacitor bottom (or top) plate 118 to form a series connection of the rolled-up inductor and the rolled-up capacitor. The multilayer sheet 102 may further comprise, on the strained layer 104 prior to rolling (and on the strain-relieved layer after rolling), an additional inductor strip 128 and a conductive line 126 connecting the additional inductor strip 128 to the common ground portion 124. The multilayer sheet 102 may also include an additional capacitor bottom plate 130, an additional portion of the insulating layer 132 on the additional capacitor bottom plate 130, and an additional capacitor top plate 134 on the additional portion of the insulating layer 132 overlying the additional capacitor bottom plate 130, where the additional capacitor top (or bottom) plate 134 is connected to the common ground portion 124. When the strained layer 104 is released from the substrate 106, the multilayer sheet 102 scrolls up and the additional capacitor top and bottom plates 130,134 and the additional portion 132 of the insulating layer curve around the longitudinal axis, thereby forming an additional rolled-up capacitor that has a shunt connection. Simultaneously, the additional inductor strip 128 wraps around the longitudinal axis, thereby forming an additional rolled-up inductor that also has a shunt connection.

The tubular band pass filter having the planar structure shown schematically in FIG. 5 may include, in one example, an 8-turn inductor in each series branch and two 3-turn inductors in parallel in the shunt branch. The tubular band pass filter may have a center frequency in the range from 10 kHz to 300 GHz and in some cases from 100 MHz to 100 GHz. The parallel connection of the inductor strips distributes weight uniformly across the entire multilayer sheet. The on-chip footprint of this exemplary tubular filter is only 10 µm×210 µm, more than 100 times smaller than existing two-dimensional filters.

In general, on-wafer footprints (areas) of less than 3000 µm$^2$ and even less than 1000 µm$^2$ may be achieved using S-RUM technology. The approach described herein may be useful for making tubular resonant filters having a footprint of about 10,000 µm$^2$ or less, about 5000 µm$^2$ or less, or about 3000 µm$^2$ or less, about 1000 µm$^2$ or less, about 500 µm$^2$ or less, or about 300 µm$^2$ or less. The footprint is typically at least about 100 µm$^2$, or at least about 200 µm$^2$.

Referring to FIGS. 6A and 6B, the additional inductor strip 128 may be part of the patterned first conductive layer 110 and may have a shorter length than the inductor strip 116. In this example, the shunt branch inductor 128 is effectively surrounded by the series branch inductor 116, thereby providing a smaller absolute inductance value. Alternatively, referring to FIGS. 7A and 7B, the additional inductor strip 128 may be part of the patterned second conductive layer 114 and may have a longer length than the inductor strip 116 from the patterned first conductive layer 110. In this example, the shunt branch inductor 128 effectively surrounds the series branch inductor 116, thereby providing a larger absolute inductance value, which may be beneficial for wide band designs. In these exemplary bandpass filter designs, several balancing strips 136 which are not connected to the LC circuit may be employed to distribute weight uniformly across the entire multilayer sheet. The balancing strips 136 may be formed as part of either the patterned first or second conductive layer 110,114.

By varying the length and width of the inductor strip(s) and the dimensions of the capacitor top and bottom plates, different values of inductance and capacitance can be achieved, which in turn determines the resonant frequency (f0), and thus the pass band frequency of band pass filters and the cut-off frequency of low pass and high pass filters.

Typically, the inductor strip has a length in the range of hundreds to thousands of microns (e.g., from about 10 microns to about 10,000 microns), where the length refers to a total length of the inductor strip including portions substantially aligned with and also perpendicular to the rolling direction. Due to the serpentine pattern followed by the inductor strip on the strained layer, the length can be quite long. The width of the inductor strip may be in the range of from about 1 micron to about 200 microns, and is more typically from about 5 microns to about 30 microns. Other details about the design of the inductor strips may be as set forth in U.S. Pat. No. 9,224,532, to Li, et al., issued on Dec. 29, 2015, and which is hereby incorporated by reference in its entirety. Typically, the capacitor top and bottom plates have a length and width in the range of from about 1 micron to 500 microns, or from about 5 microns to about 50 microns. Given the difference in the length of the inductor strips compared to the length of the capacitor plates, the former wrap around the longitudinal axis multiple times in the rolled configuration, whereas the latter tend to curve around the longitudinal axis without completing multiple turns, or even a single turn.

As explained above, the strain-relieved layer that underlies the patterned first conductive layer may comprise one or more sublayers that are at least partially relieved of lattice strain as a consequence of rolling. The multilayer sheet comprising the strain-relieved layer includes less strain (or no strain) in the rolled configuration than in an unrolled or planar configuration. Accordingly, the one or more sublayers that are referred to as a strain-relieved layer in the rolled configuration may be referred to as a strained layer in the unrolled configuration. In the example of FIGS. 1A-1D, the strain-relieved layer (and the strained layer) may comprise two sublayers, which may be referred to as a bilayer. Specifically, the strained layer or bilayer 140 may comprise a top sublayer 140a in tension and a bottom sublayer 140b in compression to facilitate the rolling up shown schematically in FIGS. 1C-1D. The bilayer 140 may thus be referred to as an oppositely strained bilayer. The strain-relieved layer and the strained layer may comprise a single crystalline, polycrystalline or amorphous material.

The strain-relieved and strained layer may comprise an electrically insulating material such as silicon nitride, silicon oxide, or boron nitride. In one example, the layer may comprise non-stoichiometric silicon nitride ($SiN_x$, where x may have a value from about 0.5 to about 1.5), which may be amorphous, or stoichiometric silicon nitride (e.g., $Si_3N_4$, $Si_2N$, $SiN$ or $Si_2N_3$). The layer may also or alternatively include another material, such as an elemental or compound semiconducting material or a polymer. For example, single crystal films such as InAs/GaAs, InGaAs/GaAs, InGaAsP/InGaAsP, Si—Ge/Si may be used as the strained layer.

Typically, the strained layer has a thickness of from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer includes two oppositely strained sublayers (a bilayer), it may be advantageous for the sublayers to have the same thickness.

The strain in the strained layer may be introduced by compositional or structural differences between sublayers that are successively deposited (e.g., by chemical vapor deposition) so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a,140b may be reversed (compressive on top; tensile on bottom) in order to have the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD may differ from single crystal films in that internal strain may be developed not by crystal lattice mismatch but rather by density differences and thermal mismatch achieved by appropriate deposition conditions. In one example, an oppositely strained $SiN_x$ bilayer may be deposited successively with low frequency (375 kHz, compressive strain) and high frequency (13.56 MHz, tensile strain) PECVD conditions.

It has been demonstrated experimentally that thin films deposited by different methods or under different conditions may provide a strained layer having adjustable values of residual stress in a wide range, such as from 478 to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a long enough distance to form as many turns as needed. To create a higher residual stress mismatch during deposition of the strained $SiN_x$ layers, for example, and thus a smaller tube diameter, the PECVD environment may be changed by adjusting a ratio of the $SiH_4$ flow rate to the $NH_3$ flow rate or by optimizing the power of the RF source. As long as the thin sheet or membrane is strained and can be released from the underlying substrate, rolled-up 3D architectures may form spontaneously with simple planar processing. The concept has been demonstrated for compound and elemental semiconductor material systems as well metal and dielectric materials, such as silicon nitride.

The first and second patterned conductive layers (which may be referred to collectively as "the patterned conductive layers") may comprise one or more high conductivity materials selected from the group consisting of carbon, silver, gold, aluminum, copper, molybdenum, tungsten, zinc, palladium, platinum and nickel. The patterned conductive layers may be formed by depositing one or more high conductivity thin films on a substrate (e.g., a planar strained layer) by a method such as sputtering or evaporation, and then patterning the thin films using lithography and etching steps known in the art. Advantageously, the patterned conductive layers may be made as thick and smooth as possible to reduce the thin film or sheet resistivity without interfering with the rolling process. The sheet resistivity of the patterned conductive layers may have a significant impact on the performance and size of the rolled-up structure and thus may be kept as low as possible. For example, the sheet resistivity may be about 5 µohm·cm or less.

Each of the patterned conductive layers may have a different thickness and/or include one or more different high conductivity materials. For example, one or both of the patterned conductive layers may have a multilayer structure, such as a Ni—Au bilayer or a Ni—Au—Ni trilayer structure. In the trilayer example, the bottom layer may act as an adhesion layer, the middle layer may act as a conductive layer, and the top layer may act as a passivation/protection layer. Typically, adhesion and passivation layers have a thickness of from about 5-10 nm.

It is also contemplated that one or both of the patterned conductive layers may comprise a two-dimensional material, such as graphene or transition metal dichalcogenides, e.g., $MoS_2$ $MoSe_2$, $WSe_2$ and/or $WS_2$. Such two-dimensional materials can be viewed as free-standing atomic planes comprising just a single monolayer or a few monolayers of atoms. For example, the patterned conductive layers may comprise a few monolayers of graphene formed on a strained $SiN_x$ bilayer, or a single monolayer of graphene may be formed on hexagonal boron nitride, which may replace the strained $SiN_x$ bilayer. It is also contemplated that one or both of the patterned conductive layers may comprise carbon nanotubes (in the form of bundles or an array) that may be grown on, for example, a quartz substrate and then transferred to a strained $SiN_x$ bilayer for roll-up.

Typically, each patterned conductive layer has a thickness of at least about 5 nm, at least about 10 nm, at least about 20 nm, at least about 50 nm, at least about 70 nm, or at least about 90 nm. The thickness may also be about 300 nm or less, about 200 nm or less, about 150 nm or less, or about 100 nm or less. For example, the thickness may range from about 50 nm to about 250 nm, or from about 100 nm to about 200 nm. However, in some embodiments, such as those in which the conductive pattern layer comprises a two-dimensional material as discussed above, the thickness may be about 1 nm or less, down to a few monolayers or to one monolayer.

The insulating material may comprise a dielectric material selected from alumina ($Al_2O_3$), silicon dioxide ($SiO_2$), titanium oxide ($Ti_2O_3$), hafnium oxide ($HfO_2$), and others. The insulating material typically has a thickness in the range of from about 0.5 nm to about 200 nm, from about 1 nm to about 100 nm, or from about 5 nm to about 50 nm. The thickness of the insulating layer may be least about 0.5 nm, at least about 5 nm, or at least about 10 nm. The thickness may also be about 200 nm or less, about 50 nm or less, or about 10 nm or less. As noted above, the patterned conductive layers and/or the insulating layer may include additional tensile strain to facilitate rolling when the sacrificial layer is removed.

The sacrificial layer may comprise a material that can be etched without removing or otherwise damaging the strained layer. For example, single crystalline and/or polycrystalline Ge, $GeO_x$, Si, and AlAs, as well as photoresist, may be used as a sacrificial layer. In one example, a strained bilayer comprising InAs/GaAs may be formed on a sacrificial layer comprising AlAs that may be etched away with hydrofluoric acid (HF). In another example, a strained bilayer comprising SiNx may be formed on a sacrificial layer comprising Ge that may be etched away with hydrogen peroxide.

The rolled configuration of the multilayer sheet may have a length along the longitudinal axis that depends on the number of inductors and capacitors and on the geometry of the patterned conductive layers. Typically, the length is at least about 10 microns, at least about 50 microns, at least about 100 microns, at least about 200 microns, or at least about 500 microns, and the length may also be about 8000 microns or less, about 5000 microns or less, or about 1000 microns or less. For example, the length may range from about 10 microns to about 8000 microns, or from about 100 microns to about 3000 microns, or from about 300 microns to about 1000 microns.

In addition, the rolled configuration of the multilayer sheet may have a diameter (inner diameter) of from about 1 micron to about 1000 microns, or from about 5 microns to about 500 microns. Typically, the inner diameter of the rolled configuration is no more than about 500 microns, no more than about 300 microns, or no more than about 100 microns. The inner diameter may also be at least about 1 micron, at least about 5 microns, or at least about 10 microns. The inner diameter of the rolled configuration depends on the thickness of the multilayer sheet as well as the amount of strain in the unrolled strained layer prior to release of the sacrificial layer. A thicker multilayer sheet may tend to roll to a larger inner diameter; however, a higher level of strain in the strained layer can offset this effect, since the inner diameter (D) of the rolled configuration is proportional to the thickness (t) of the multilayer sheet and is inversely proportional to the amount of strain ($\in$) therein ($D \propto t/\in$).

To maximize the inductance and quality factor of the rolled-up inductor(s), it may be advantageous to maximize the ratio of the thickness of the patterned conductive layer (e.g., the thickness of the conductive strips) to the inner diameter of the rolled configuration. For example, the ratio may be about 0.005 or greater, about 0.007 or greater, about 0.01 or greater, or about 0.015 or greater. The ratio is typically about 0.03 or less, or about 0.02 or less. In one example, a ratio of 0.01 can be calculated for a conductive pattern layer thickness of 100 nm (0.1 micron) and a rolled configuration diameter of 10 microns. It may also be advantageous in terms of the properties of the rolled-up inductor(s) to form the rolled configuration with a large number of turns.

The number of turns in the rolled configuration is influenced by (a) the length of the multilayer sheet in the rolling or circumferential direction, (b) the thickness t of the multilayer sheet, and (c) the amount of strains in the multilayer sheet prior to rolling. For filters working at frequencies ranging from a few kHz (e.g., 10 kHz) to as high as 300 GHz, the number of turns typically ranges from about 5 to about 100, or from about 5 to about 60. For example, the rolled configuration may include at least about 5 turns, at least about 10 turns, at least about 20 turns, at least about 40 turns, or at least about 60 turns. Typically, the rolled configuration includes no more than about 100 turns, no more than about 80 turns, or no more than about 60 turns. The number of turns can be influenced by the size (e.g., length and thickness) and shape of the multilayer sheet before rolling up.

A method of making a tubular resonant filter for a RFIC is described in general first and then in greater detail below in reference to FIGS. 8A-8G. The method includes forming a sacrificial layer 108 on a substrate 106 and forming a strained layer 104 on the sacrificial layer 108, where the strained layer 104 comprises an upper portion under tensile stress and a lower portion under compressive stress. The strained layer 104 is held on the substrate 106 by the sacrificial layer 108. A patterned first conductive layer 110 is formed on the strained layer 104, an insulating layer 112 is formed on the patterned first conductive layer 110, and a patterned second conductive layer 114 is formed on the insulating layer 112 and the patterned first conductive layer 110. The aforementioned layers may have any of the characteristics described elsewhere in this disclosure. After deposition of the layers, an end of the sacrificial layer 108 may be exposed. Removal of the sacrificial layer 108 from the substrate 106 is initiated, thereby releasing an end of the strained layer 104, and the removal continues to allow the strained layer 104 to move away from the substrate 106 and roll up to relieve strain in the strained layer 104. The patterned conductive layers 110,114 and insulating layer 112 adhere to the strained layer 104 during the roll-up, and a tubular resonant filter 200 including a rolled-up inductor electrically connected to a rolled-up capacitor is formed. As described above, depending on the interrelationship of the layers and the type of filter (e.g., low-pass, high-pass, band-pass), the tubular resonant filter may contain additional inductors and/or capacitors.

An exemplary S-RUM process is now described. Referring again to FIG. 8A, a sacrificial layer 108 may be formed on a wafer substrate 106. A vapor deposition method such as electron beam evaporation or sputtering may be used. In this example, the sacrificial layer 108 comprises Ge deposited to a thickness of about 20 nm in thickness, although the thickness of the sacrificial layer 108 may more generally range from about 5 nm to about 50 nm, and other selectively etchable materials may be used.

Optical lithography is used to define the desired substrate region followed by reactive ion etching (RIE), or another suitable etching method, to remove unwanted portions of the sacrificial layer 108 and etch a considerable depth into the wafer substrate 106, as illustrated in FIG. 8B, thereby forming the mesa 106a.

Referring to FIG. 8C, the next step is strained layer deposition, where low and high frequency plasma enhanced chemical vapor deposition (PECVD) processes may be employed in sequence to deposit the strained layer 104. In one example, a 40 nm strained $SiN_x$ bilayer is deposited to cover the sacrificial layer 108 and mesa 106a using dual-frequency PECVD. The bilayer may include low frequency (LF) and high frequency (HF) $SiN_x$ thin films of 20 nm in thickness (each) and with a residual stress of −900 MPa and +300 MPa, respectively. Generally speaking, forming the strained layer 104 may entail depositing two sublayers that have different lattice parameters, different stoichiometries, density differences and/or thermal mismatch, as discussed above, using CVD or another deposition technique.

Referring to FIG. 8D, the patterned first conductive layer 110 may be formed by depositing a conductive thin film on the strained layer by a vapor deposition method such as sputtering or evaporation, and then patterning the conductive thin film using lithography and etching steps known in the art. In one example, a 5 nm Ni/60 nm gold (Au) inductor strip 116 and a capacitor bottom plate 118 may be formed by electron beam evaporation followed by metal lift-off.

As shown in FIG. 8E, the insulating layer (e.g., 5 nm of aluminum oxide) 112 may be deposited using a technique such as atomic layer deposition (ALD). Portions of this layer serve as the dielectric of any capacitors, and the insulating layer 112 can also provide tensile stress to enhance roll-up.

Referring to FIG. 8F, the patterned second conductive layer 114 may be formed on the insulating and patterned first conductive layers 112,110 by electron beam evaporation or another deposition technique known in the art, followed by metal lift-off technology. For example, another deposition of 5 nm Ni/50 nm Au may be employed to form one or more capacitor top plates 120, connecting lines 126, shunt branch inductors, and/or other conductive features.

Optical lithography followed by RIE may be employed to create a deep trench down to the substrate, thereby forming openings in the layers that allow access to the underlying sacrificial layer 108, as shown schematically in FIG. 8F. Finally, an appropriate etchant may be used to etch the sacrificial layer 108 and enable the strained layer 104 to be released and to roll up (as shown for example in FIGS. 2B and 2C), thereby forming a tubular resonant filter 200. In the case of a Ge sacrificial layer 108, the wet etching may be carried out using hydrogen peroxide as the etchant at 90° C.

A rolled-up tubular resonant filter 200 for a RFIC may be formed by the above-described method and may further be transferred to a different substrate (e.g., via transfer printing), which may be a semiconductor wafer with predesigned RFICs. Transfer printing may allow high density packing of individual devices.

Figure 9A:
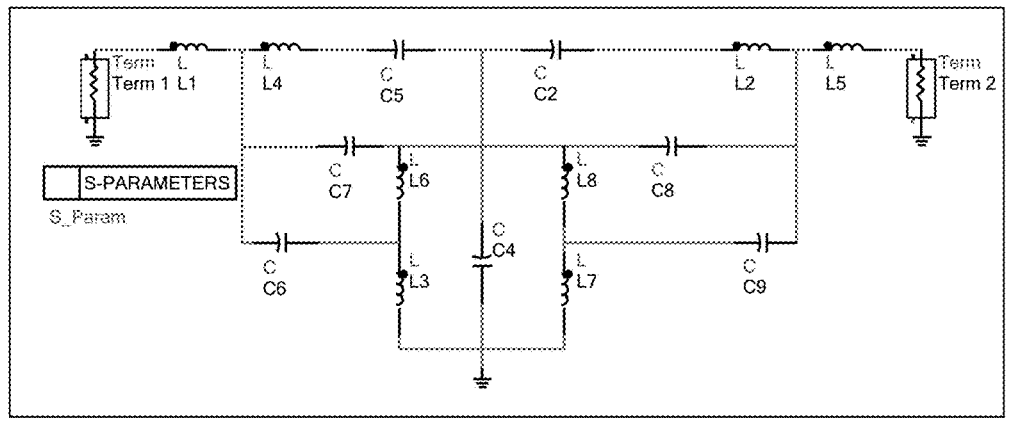
FIG. 9A shows a schematic of a model employed for optimizing a band pass tubular resonant filter.

In order to precisely predict the performance of rolled-up filters, a physical model and an equivalent circuit model are used to perform the structure design. The physical model is based on the low-pass filter prototype model, and the value of the rolled-up inductor and capacitor elements are calculated by analytical methods. For the rolled-up inductor, inductance $L_{resonator}$ is governed by:

$$L_{resonator} = \frac{N[R^2 + \omega^2(L')^2]\{L' - C[R^2 + \omega^2(L')^2]\}}{R^2 + \omega^2\{L' - C[R^2 + \omega^2(L')^2]\}^2}, \quad (a)$$

where N is the number of spiral turns, C is the parasitic capacitance value of the spiral inductor, $L'=L-2(1-N^{-1})M$, with M being the mutual inductance between adjacent spirals and L being the self-inductance of one spiral turn. For the rolled-up capacitor, capacitance $C_{resonator}$ is governed by:

$$C_{resonator} = \frac{C_0}{1 - \omega^2 L_{resonator\_1turn} C_0},$$

where $C_0 = \mu_r \mu_0 A t_{dielectric}^{-1}$ is the capacitor's value of metal-insulator-metal (MIM) planar capacitor with the same plate dimension. Unwanted crosstalk capacitances can be taken into account in the design by building up a lumped circuit model in the commercial software Advanced Design System (ADS). FIG. 9A indicates such an example of a tubular band pass filter design case. Optimization method can then be used to find the best value of all parameters to finalize the structure design. The accuracy of the roll-up control may be confirmed by a final finite element method (FEM) modeling.

Figure 9B:
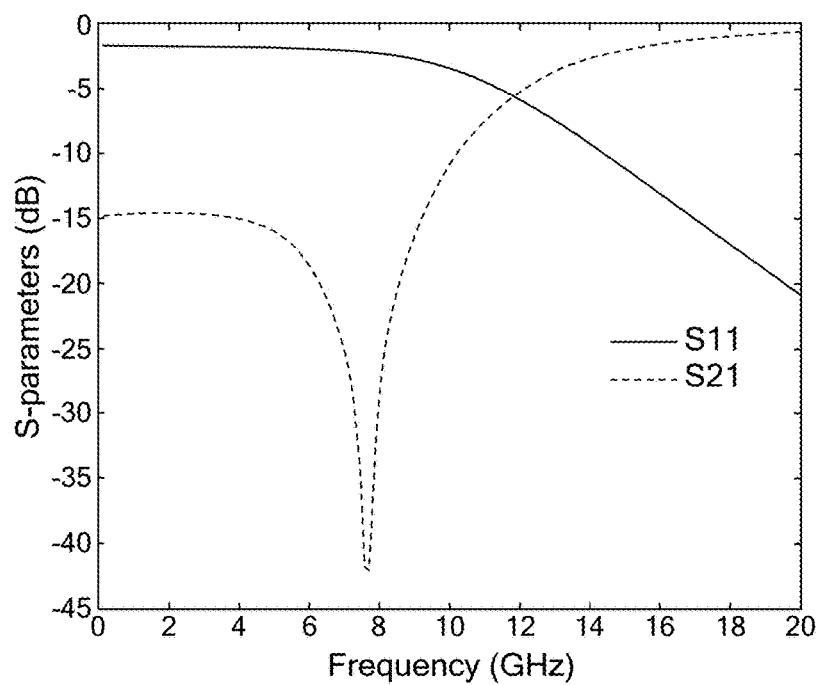
FIGS. 9B-9G show simulation results for several tubular resonant filters designed for different application scenarios in important frequency bands, including.
Figure 9C:
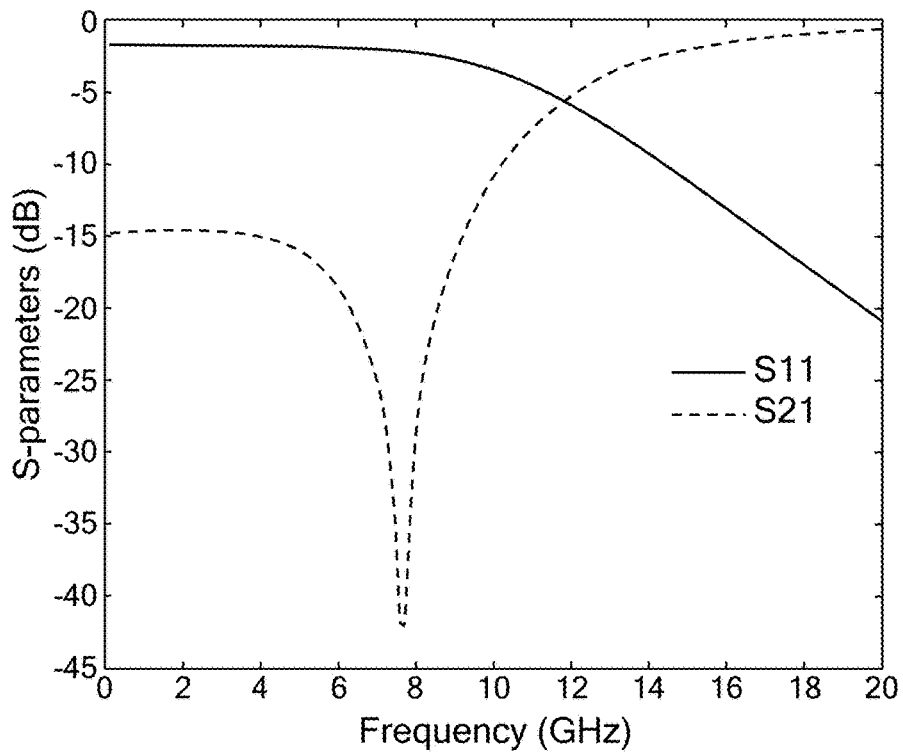
Figure 9D:
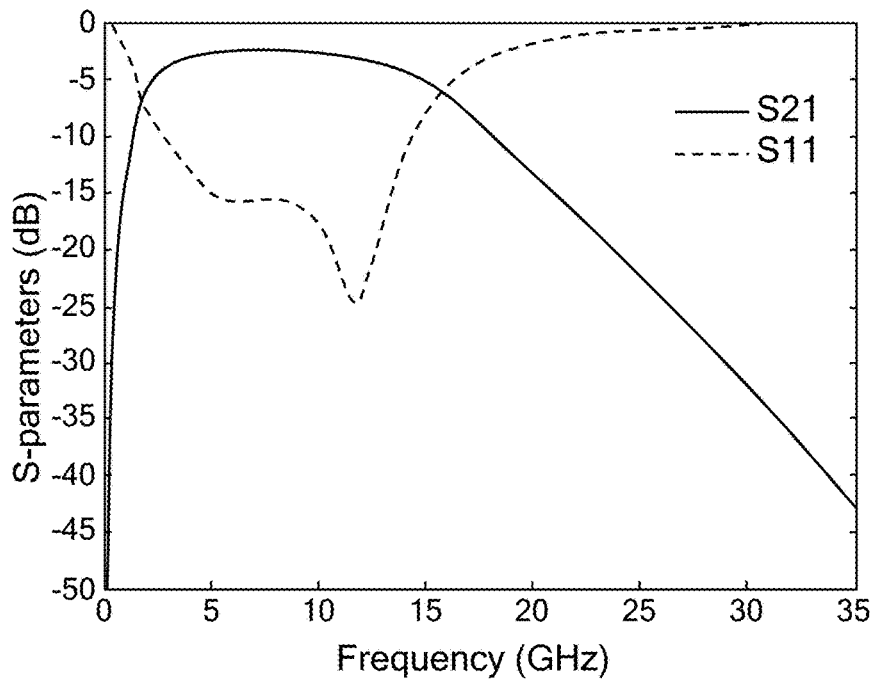
Figure 9E:
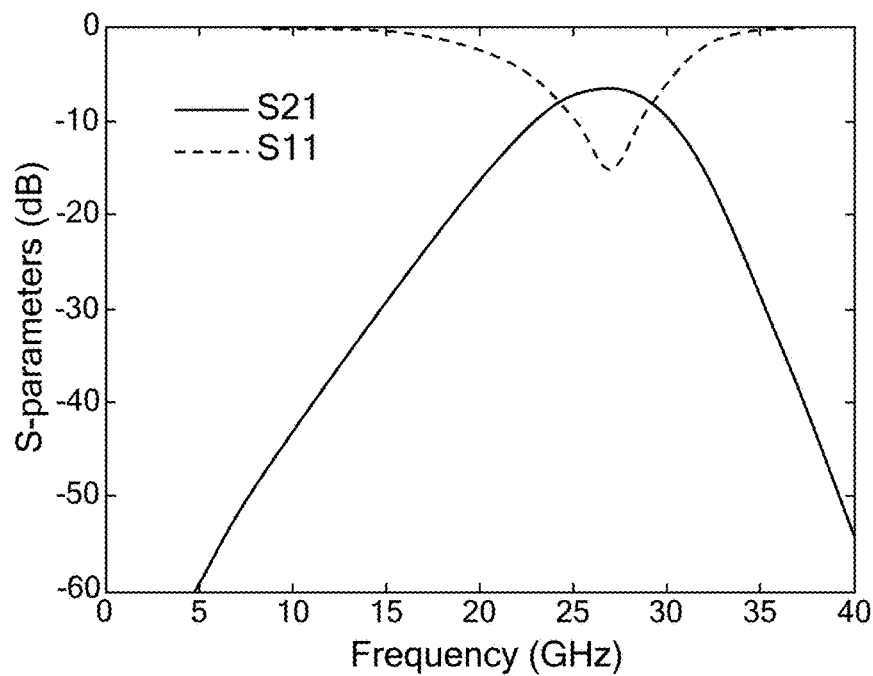
Figure 9F:
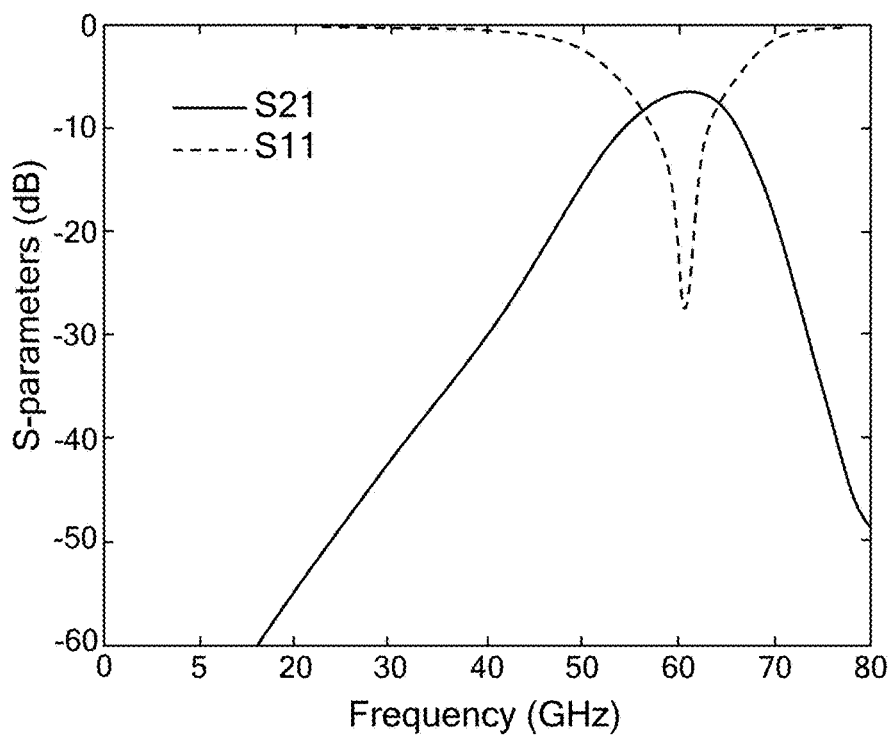
Figure 9G:
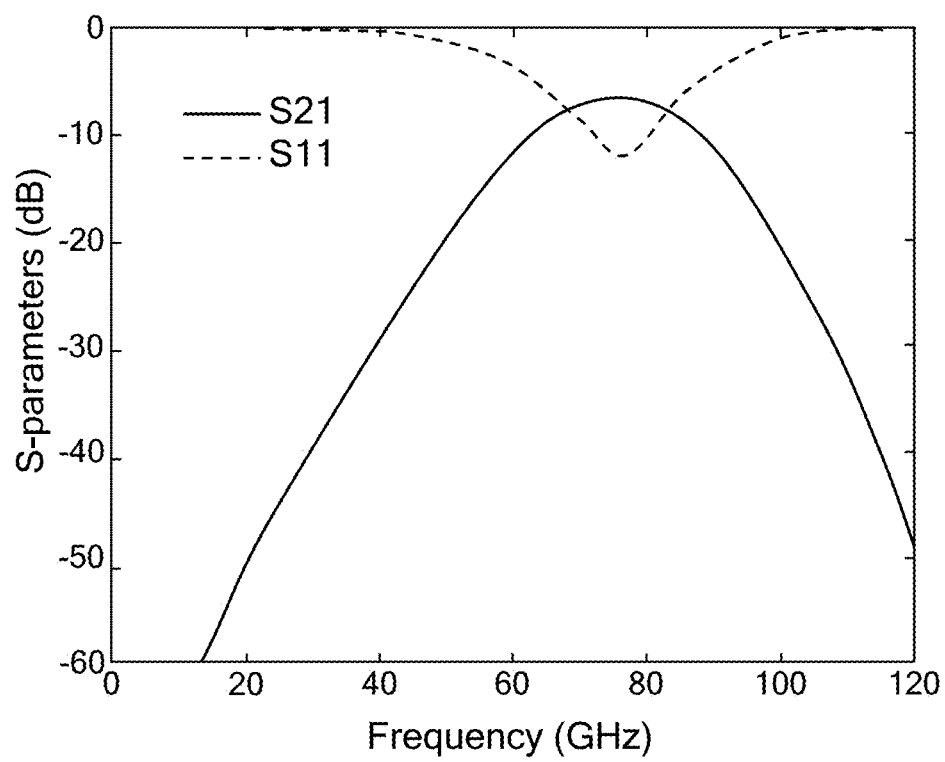

FIGS. 9B-9G show simulation results for several tubular resonant filters designed for different application scenarios in important frequency bands. As indicated above, the tubular resonant filters may have a cutoff or pass band frequency in the range of 10 kHz to 300 GHz, where the most significant advantages over existing devices may be found in the range of 100 MHz to 100 GHz. The term "S-parameters" refers scattering parameters, where S11 is input port reflection and S21 is forward gain or insertion loss, since these are passive devices and the gain is negative. FIG. 9B shows a low pass tubular filter working up to 8 GHz with return loss −18 dB and insertion loss −2 dB. FIG. 9C shows a high pass tubular filter working up to 15 GHz with return loss −17 dB and insertion loss −1.5 dB. FIG. 9D shows a wide band pass tubular filter working in X band from 5 GHz to 12 GHz with return loss −15 dB and insertion loss −2.5 dB. FIG. 9E shows a band pass tubular filter working in K band from 25 GHz to 27 GHz with return loss −18 dB and insertion loss −8 dB. FIG. 9F shows a band pass tubular filter working in U/E band from 59 GHz to 61 GHz with return loss −18 dB and insertion loss −7 dB. FIG. 9G shows a band pass tubular filter working in E band from 65 GHz to 81 GHz with return loss −12 dB and insertion loss −8 dB. All the exemplary filters were fabricated using 110 nm-thick Au metal strips. Compared to the smallest existing lumped on-chip filters, the tubular resonant filters have a footprint in the range of 10×200 μm$^2$, which is more than 70 times smaller than that of their counterparts.

The tubular resonant filters described herein can have an all-frequency-band design, which is impossible from existing filter technology, and have comparable insertion loss to the state-of-the-art filters while enjoying significant on-chip area efficiency improvement. This advantage is more pronounced when working at ultra-wide band (3.1-10.6 GHz) for near field communication (NFC) and wireless local area network (WLAN). More than 70× chip area reduction has been achieved with comparable insertion loss.

With their extremely compact size, high frequency and ultra wide band operation capability, the tubular resonant filters described are suitable for a number of existing and emerging applications, such as high data rate communication portable devices. When working at an unlicensed spectrum around 10 GHz or 60 GHz, the ultra-compact tubular resonant filters can be designed with a bandwidth of more than 5 GHz, making the data transmission speed as high as several gigabytes per second. Popular next generation high speed technologies like portable wireless high definition (WirelessHD) display, high speed wireless big data synchronization, download, and storage on portable devices may benefit from the excellent properties of tubular resonant filters. The compact size of the tubular filters also makes them good candidates for home automation. Small appliances like LED bulbs can be connected to a wireless local area network (WLAN) using WiFi chips with S-RUM filters. Furthermore, the tubular filters are compatible with wearable electronics technology. Unlike filters based on 2D processing, the electromagnetic field within the tubular filter may remain stable even when the substrate undergoes deformation. This stability along with the extremely small footprint may enable the tubular resonant filters to be used on flexible or rigid substrates with significant strains and large curvatures. Potential applications can be found in wearable computing electronics like smart glasses and wristwatches, body-centric communication systems, wireless sensors for medical imaging and positioning, and Internet of Things (IoT) applications.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. A tubular resonant filter for a radio frequency integrated circuit (RFIC), the tubular resonant filter comprising:
   a multilayer sheet in a rolled configuration comprising multiple turns about a longitudinal axis and having an on-wafer footprint of about 5000 $\mu m^2$ or less, the multilayer sheet including:
   a strain-relieved layer;
   a patterned first conductive layer on the strain-relieved layer;
   an insulating layer on the patterned first conductive layer; and
   a patterned second conductive layer on the insulating layer and the patterned first conductive layer,
   wherein the patterned first and second conductive layers and the insulating layer are interrelated to form a rolled-up inductor connected to a rolled-up capacitor on the strain-relieved layer.

2. The tubular resonant filter of claim 1, wherein the patterned first conductive layer comprises:
   an inductor strip, and
   a capacitor bottom plate in electrical contact with the inductor strip,
   wherein the inductor strip wraps around the longitudinal axis in the rolled configuration, thereby forming the rolled-up inductor.

3. The tubular resonant filter of claim 2, wherein the inductor strip is disposed in a serpentine pattern having an amplitude extending in a rolling direction.

4. The tubular resonant filter of claim 2, wherein the patterned second conductive layer comprises:
   a capacitor top plate on a portion of the insulating layer and overlying the capacitor bottom plate,
   wherein the capacitor top and bottom plates and the portion of the insulating layer curve around the longitudinal axis in the rolled configuration, thereby forming the rolled-up capacitor.

5. The tubular resonant filter of claim 4, wherein the multilayer sheet is disposed on a substrate comprising:
   two contact pads, at least one of the two contact pads being connected to the inductor strip; and
   a common ground portion electrically isolated from the two contact pads.

6. The tubular resonant filter of claim 5, wherein both of the two contact pads are connected to the inductor strip to form a series connection of the rolled-up inductor, and
   wherein a conductive line connects the capacitor top plate to the common ground portion to form a shunt connection of the rolled-up capacitor.

7. The tubular resonant filter of claim 5, wherein one of the two contact pads is connected to the capacitor bottom plate and one of the two contact pads is connected to the capacitor top plate to form a series connection of the rolled-up capacitor, and
   wherein a conductive line connects the inductor strip to the common ground portion to form a shunt connection of the rolled-up inductor.

8. The tubular resonant filter of claim 5, wherein both of the two contact pads are connected to the inductor strip and the capacitor top or bottom plate to form a series connection of the rolled-up inductor and the rolled-up capacitor,
   wherein the multilayer sheet further comprises, on the strain-relieved layer:
   an additional inductor strip and an additional conductive line connecting the additional inductor strip to the common ground portion; and
   an additional capacitor bottom plate, an additional portion of the insulating layer on the additional capacitor bottom plate, and an additional capacitor top plate on the additional portion of the insulating layer overlying the additional capacitor bottom plate, the additional capacitor top or bottom plate being connected to the common ground portion,
   wherein the additional capacitor top and bottom plates and the additional portion of the insulating layer curve around the longitudinal axis in the rolled configuration, thereby forming an additional rolled-up capacitor having a shunt connection, and
   wherein the additional inductor strip wraps around the longitudinal axis in the rolled configuration, thereby forming an additional rolled-up inductor having a shunt connection.

9. The tubular resonant filter of claim 8, wherein the additional inductor strip is part of the patterned first conductive layer and has a shorter length than the inductor strip.

10. The tubular resonant filter of claim 8, wherein the additional inductor strip is part of the patterned second conductive layer and has a longer length than the inductor strip.

11. The tubular resonant filter of claim 1, wherein the strain-relieved layer comprises two layers, and wherein, in an unrolled configuration of the multilayer sheet, a top layer of the two layers is in tension and a bottom layer of the two layers is in compression.

12. The tubular resonant filter of claim 11, wherein each of the two layers comprises non-stoichiometric silicon nitride.

13. The tubular resonant filter of claim 1, wherein each of the patterned first and second conductive layers comprises one or more materials selected from the group consisting of carbon, silver, gold, aluminum, copper, molybdenum, tungsten, zinc, palladium, platinum, and nickel.

14. The tubular resonant filter of claim 1, wherein each of the patterned first and second conductive layers comprises a thickness of from about 50 nm to about 250 nm.

15. The tubular resonant filter of claim 1, wherein the rolled configuration comprises at least about 5 turns about the longitudinal axis.

16. The tubular resonant filter of claim 1 comprising a pass band or cutoff frequency in the range of from about 10 kHz to about 300 GHz.

17. A tubular resonant filter for a radio frequency integrated circuit (RFIC), the tubular resonant filter comprising:
a multilayer sheet in a rolled configuration comprising multiple turns about a longitudinal axis, the multilayer sheet including:
a strain-relieved layer;
a patterned first conductive layer on the strain-relieved layer, the patterned first conductive layer comprising an inductor strip and a capacitor bottom plate in electrical contact with the inductor strip;
an insulating layer on the patterned first conductive layer; and
a patterned second conductive layer on the insulating layer and the patterned first conductive layer, the patterned second conductive layer comprising a capacitor top plate on a portion of the insulating layer and overlying the capacitor bottom plate,
wherein the inductor strip wraps around the longitudinal axis and the capacitor top and bottom plates and the portion of the insulating layer curve around the longitudinal axis to form a rolled-up inductor connected to a rolled-up capacitor.

18. A method of making a tubular resonant filter for a radio frequency integrated circuit (RFIC), the method comprising:
forming a sacrificial layer on a substrate;
forming a strained layer on the sacrificial layer, the strained layer comprising an upper portion under tensile stress and a lower portion under compressive stress, the strained layer being held on the substrate by the sacrificial layer;
forming a patterned first conductive layer on the strained layer, the patterned first conductive layer comprising an inductor strip and a capacitor bottom plate in electrical contact with the inductor strip;
forming an insulating layer on the patterned first conductive layer; and
forming a patterned second conductive layer on the insulating layer and the patterned first conductive layer;
initiating removal of the sacrificial layer from the substrate, thereby releasing an end of the strained layer; and
continuing the removal of the sacrificial layer, thereby allowing the strained layer including the patterned first and second conductive layers and the insulating layer to move away from the substrate and roll up to a rolled configuration to relieve strain in the strained layer, the inductor strip wrapping around a longitudinal axis of the rolled configuration, thereby forming a tubular resonant filter including a rolled-up inductor electrically connected to a rolled-up capacitor.

19. The method of claim 18, wherein the patterned second conductive layer comprises:
a capacitor top plate on a portion of the insulating layer and overlying the capacitor bottom plate,
wherein the capacitor top and bottom plates and the portion of the insulating layer curve around the longitudinal axis in the rolled configuration, thereby forming the rolled-up capacitor.

20. A tubular resonant filter for a radio frequency integrated circuit (RFIC), the tubular resonant filter comprising:
a multilayer sheet in a rolled configuration comprising multiple turns about a longitudinal axis, the multilayer sheet including:
a strain-relieved layer;
a patterned first conductive layer on the strain-relieved layer;
an insulating layer on the patterned first conductive layer; and
a patterned second conductive layer on the insulating layer and the patterned first conductive layer,
wherein the patterned first and second conductive layers and the insulating layer are interrelated to form a rolled-up inductor connected to a rolled-up capacitor on the strain-relieved layer, and
wherein the strain-relieved layer comprises two layers, and wherein, in an unrolled configuration of the multilayer sheet, a top layer of the two layers is in tension and a bottom layer of the two layers is in compression, each of the two layers comprising non-stoichiometric silicon nitride.

* * * * *